US007311953B2

(12) United States Patent
Araya et al.

(10) Patent No.: US 7,311,953 B2
(45) Date of Patent: Dec. 25, 2007

(54) COLORED COMPOSITION FOR COLOR FILTER AND DISPLAY USING COLOR FILTERS FORMED OF THE COLORED COMPOSITION

(75) Inventors: Kotaro Araya, Hitachiota (JP); Hiroshi Sasaki, Mito (JP); Yasushi Tomioka, Hitachi (JP)

(73) Assignee: Hitachi Displays, Ltd., Chiba (JP)

( * ) Notice: Subject to any disclaimer, the term of this patent is extended or adjusted under 35 U.S.C. 154(b) by 439 days.

(21) Appl. No.: 10/916,875

(22) Filed: Aug. 11, 2004

(65) Prior Publication Data

US 2005/0048224 A1 Mar. 3, 2005

(30) Foreign Application Priority Data

Aug. 29, 2003 (JP) ............................. 2003-209591

(51) Int. Cl.
*G02B 5/20* (2006.01)
*C09B 67/22* (2006.01)

(52) U.S. Cl. ...................... 428/1.31; 428/1.1; 524/514; 430/7; 430/109.5; 353/84; 349/80; 349/1.6; 106/410; 106/495; 106/497

(58) Field of Classification Search ................ 428/1.1, 428/1.31; 524/514; 430/7, 109.5; 353/84; 349/80, 106; 106/410, 495, 497–498
See application file for complete search history.

(56) References Cited

U.S. PATENT DOCUMENTS 5,561,232 A * 10/1996 Hao et al. ...................... 546/14
5,907,005 A * 5/1999 Shimizu ...................... 524/104
5,968,688 A * 10/1999 Masuda et al. ................. 430/7
6,049,318 A * 4/2000 Ota .............................. 345/93
6,384,529 B2 * 5/2002 Tang et al. .................. 313/506
6,391,507 B1 * 5/2002 Macholdt et al. ...... 430/108.24
6,544,325 B2 * 4/2003 Hall-Goulle et al. ........ 106/410
6,656,985 B1 * 12/2003 Yoshihara et al. ............ 524/99
6,665,030 B2 * 12/2003 Hanazawa et al. .......... 349/113
6,916,928 B2 * 7/2005 Becker et al. ................ 546/37

FOREIGN PATENT DOCUMENTS

| JP | 08-006242 | 1/1996 |
| JP | 11-305032 | 11/1999 |
| JP | 2002-72465 | 3/2002 |
| JP | 2002-309135 | 10/2002 |

OTHER PUBLICATIONS

John Wiley & Sons, "Protective Groups in Organic Synthesis", pp. 223-249, 1981.

* cited by examiner

*Primary Examiner*—Rena Dye
*Assistant Examiner*—Sow-Fun Hon
(74) *Attorney, Agent, or Firm*—Hogan & Hartson LLP

(57) ABSTRACT

An object of the present invention is to obtain color filters having a high contrast, a high color purity and an improved transmittance for blue color, and a display using the color filters. In the present invention, there is used a colored composition for color filter comprising at least one coloring agent, a base polymer and at least one solvent, said base polymer containing a polyamicacid whose light transmittance decreases by 2% or less in the visible region (wavelength: 400 nm to 800 nm).

8 Claims, 5 Drawing Sheets

COLORED COMPOSITION FOR COLOR FILTER AND DISPLAY USING COLOR FILTERS FORMED OF THE COLORED COMPOSITION

INCORPORATION BY REFERENCE

The present application claims priority from Japanese application JP2003-209591 filed on Aug. 29, 2003, the content of which is hereby incorporated by reference into this application.

BACKGROUND OF THE INVENTION

The present invention relates to a colored composition for color filter which permits color display, and a display using color filters formed of the colored composition.

As thin and light color displays, flat panel displays such as liquid crystal displays, organic light emission displays and plasma display panels have been put to practical use or are under study for their practical application. For example, the liquid crystal displays have already been put to practical use as devices which fundamentally comprise two glass substrates and a liquid crystal layer (a liquid crystal composition) held between them and display letters, figures, drawings, pictures and the like owing to electro-optical effects. As to the driving mode of the liquid crystal displays, there are known TN (twisted nematic) method, STN (supertwisted nematic) method, FLC (ferroelectric liquid crystal) method, IPS (in-plane switching) method and the like. In the liquid crystal displays, color display is carried out by passing light transmitted by a liquid crystal layer at each pixel through a color filter. Leading displays as such liquid crystal displays have been changed to displays for desktop monitors from conventional displays for notebook-sized personal computers, and the liquid crystal displays are indispensably used in large-screen televisions. Therefore, it is increasingly desirable to improve the liquid crystal displays in performance characteristics and reduce their production cost.

The organic light emission displays are so-called self-luminous displays in which organic light-emitting layers are driven by application of an electric current to emit light. As the organic light emission displays, there are displays in which color display is carried out by utilizing the emission of lights having a plurality of colors, respectively, depending on materials for the organic light-emitting layers themselves, and displays in which color display is carried out by forming all pixels by the use of a whitely luminescent material and passing light emitted by the luminescent material through color filters provided for two or more colors, respectively.

In displays in which color display is carried out by the use of color filters, among the above-mentioned displays, color display is carried out by utilizing color filters of two or more colors (typically, the three primary colors, i.e., red (R), green (G) and blue (B), or complementary colors for the three primary colors, i.e., cyan (C), magenta (M) and yellow (Y)). Materials for such color filters, production processes and properties for display of the color filters, and the like are explained below.

Although the explanation is given herein by taking the case of the color filters of the liquid crystal display, it applies also to the color filters of other displays. The color filters used in the liquid crystal display are composed of a striped or dotted pattern having the above-mentioned colors, i.e., red, green and blue. The color development in each of these color filters is due to a component obtained by dissolving or dispersing a dye or pigment as a coloring agent in an acrylic base polymer, and the color filter is formed by applying the base polymer containing the coloring agent on a glass substrate to a thickness of about 1 micron. It will be increasingly desirable to improve the color filters in performance characteristics and reduce their production cost.

As the coloring agent of the color filter, a dye dissolved as molecules in the base polymer is superior from the viewpoint of contrast. However, a liquid crystal composition is contaminated in some cases with the dye owing to the diffusion of the dye itself into liquid crystals from the color filter, and the contamination causes nonuniform display. Moreover, a color change caused by the photo-deterioration of the dye is fatal to the color filter, and a pigment superior in light resistance is unavoidably used in current color filters at the cost of contrast. JP-A-2002-309135 discloses a technique for improving contrast by reducing the particle size of a pigment. The technique disclosed in this reference, however, involves a pigment atomization step and only increases the production cost by increasing the number of steps.

JP-A-8-6242 discloses a technique for improving contrast by using latent pigments as coloring agents. In the technique disclosed in JP-A-8-6242, pigments are solubilized by molecular modification in a step of dispersing them in a base polymer and each pigment modified is restored to its original state by removing a substituent used for the molecular modification, by light and heat treatments after forming the base polymer. However, in the case of the latent pigments, the dissolution of an acrylic resin as base polymer in a solvent is not sufficient. Therefore, JP-A-2002-72465 discloses a method for making up for a deficiency in coloring density by a combination of latent pigments and pigments.

As the base polymer, an acrylic resin is generally used because of a combination of a pigment dispersion method and photo-etching. Not only the acrylic resin but also other polymers used as the base polymer can absorb light in the vicinity of 400 nm near the ultraviolet region, in the visible region (wavelength: 400 nm to 800 nm) and are often colored yellow. This coloring becomes more remarkable owing to heat treatment such as post-baking. This phenomenon of coloring causes a decrease in transmittance for blue color in a color filter and hence is a problem to be solved for realizing the improvement of the color filter in performance characteristics.

There are base polymers which are transparent in the visible region, but such base polymers are often unusable from the viewpoint of compatibility with a solvent, for example, they are often unusable because their solubility in a solvent for them, which is absolutely necessary in a pigment dispersion method, is low. In addition, even if they are soluble in the solvent, this solubility does not result in the reduction of coloring owing to the influence of, for example, a sensitizer necessary to photo-setting base polymers. Such a phenomenon of coloring remarkably affects the color purity of the color filters with respect also to a combination of the color filters and a backlight. That is, it is expectable to improve the color purity by replacing a cold-cathode tube with a light emitting diode (LED) as a backlight, but this replacement cannot be expected to be very effective when there is the phenomenon of coloring.

As described above, production processes of color filters are broadly divided into a pigment dispersion method and a method using dyes, according to the kind of a coloring agent. In practice, the former, i.e., the pigment dispersion method is adopted for mass production in view of, for example, light resistance. In the pigment dispersion method, a photosensitive base polymer solution containing a red pigment dispersed therein is applied on a substrate having a black matrix formed thereon and is dried, after which etching is conducted by the use of a photomask to form red colored portions in the form of stripes. Subsequently, the same procedure as above is repeated except for using a blue pigment and then a green pigment, to produce color filters. Therefore, the number of steps for the production is large.

As described above, the production of color filters by the pigment dispersion method involves many steps. This is a cause for an increase of the production cost. When a coming increase in the size of a liquid crystal display is considered, an increase in the cost of a production apparatus itself is possible. JP-A-11-305032 discloses a process for producing color filters by adopting an ink jet method. This production process can be adopted only when dyes are used as coloring agents, and it is still disadvantageous, for example, in that a nozzle for ink jet is choked when pigments are used.

A first object of the present invention is to solve the problems in color filters described in the case of the above prior arts, i.e., the contrast decrease, the color purity decrease, the decrease in transmittance for blue color, and the like, and provide a colored composition for color filter which has made it possible to improve productivity in the production of color filters and achieve the improvement of the color filters in performance characteristics and the reduction of their production cost at the same time. A second object of the present invention is to provide a display having a high contrast, a high color purity and an increased transmittance for blue color.

SUMMARY OF THE INVENTION

In order to achieve the above first object, the following colored composition for color filter is used in the present invention. That is, as a colored composition for color filter comprising at least one coloring agent, a base polymer and at least one solvent, there is used a colored composition for color filter containing as the aforesaid base polymer a polyamicacid whose light transmittance decreases by 2% or less in the visible region (wavelength: 400 nm to 800 nm). In order to achieve the above second object, a display is constructed by the use of color filters formed of the abovementioned colored composition for color filter, in the present invention.

Needless to say, the present invention is not limited to the constitutions described above and the constitutions described in the embodiments described hereinafter, and various changes and modifications may be made without departing from the technical idea for the invention.

Other objects, features and advantages of the invention will become apparent from the following description of the embodiments of the invention taken in conjunction with the accompanying drawings.

Figure 1:
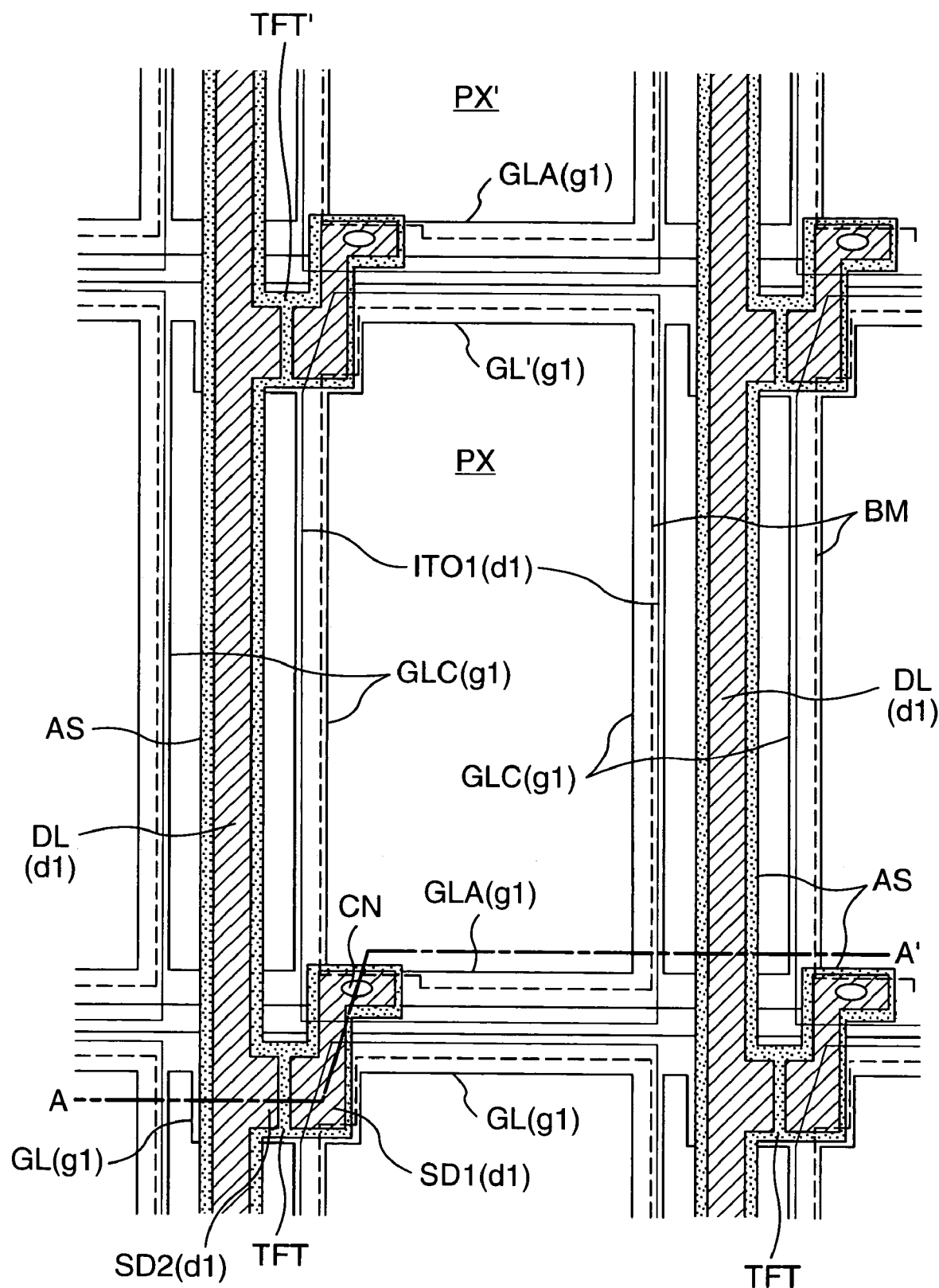
FIG. 1 is a cross-sectional view schematically illustrating the structure near one pixel of a liquid crystal panel constituting a liquid crystal display as one example of the display of the present invention.

TFT—thin-film transistor, DL—drain line (picture signal line), GL, GLA and GLC—gate lines (scanning signal lines), AS—semiconductor layer, GT—gate electrode, SD1—source electrode, SD2—drain electrode, PX—pixel electrode, CN—contact hole, SUB1—first substrate (pixel electrode substrate), SUB2—second substrate (color filter substrate), GI—gate insulating film, PSV1 and PSV2—insulating layers (insulating protective films), ITO1—transparent electroconductive film constituting a pixel electrode PX, ORI1—an alignment layer on the first substrate side, ORI2—an alignment layer on the second substrate side, LC—liquid crystal layer (liquid crystal composition layer), E—electric field, BM—black matrix, FIL—color filter, ITO2—counter electrode, PX—pixel, OLE—organic light-emitting layer, CF—color filter, CD—first electrode layer (cathode), AD—second electrode layer (anode).

DETAILED DESCRIPTION OF THE INVENTION

Embodiments of the present invention are explained below in detail. At first, the constituents of the colored composition for color filter of the present invention, i.e., the base polymer, the coloring agent(s) and the solvent(s) are explained. The explanation is made with reference to the following structural formulas (3-1), (3-2) and (3-3):

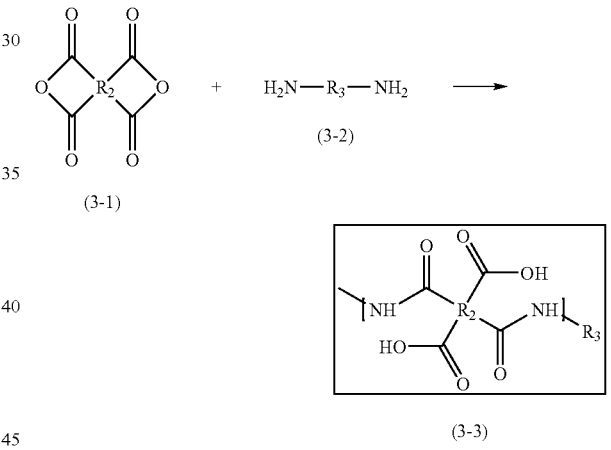

A polyamicacid of the structural formula (3-3) used as the base polymer can be synthesized by ring-opening polyaddition of a tetracarboxylic acid dianhydride of the structural formula (3-1) and a diamine derivative of the structural formula (3-2). As the polyamicacid that is transparent in the visible region (wavelength: 400 nm to 800 nm), there can be exemplified polyamicacids obtained by the following combination: each of $R_2$ in the structural formula (3-1) and $R_3$ in the structural formula (3-2) is a linear aliphatic group or a cyclic aliphatic group.

The transparency of the base polymer in the visible region (wavelength: 400 nm to 800 nm) is affected by the thickness of the base polymer, and the transmittance of the base polymer used in a color filter has to be 98% or more at a thickness of the base polymer of about 1 µm (namely, the decrease of the light transmittance is 2% or less). The effects of employment of the polyamicacid as the base polymer are as follows. Not only the transparency in the visible region but also the interaction of the polyamicacid with the amino group or the like of the coloring agent can be expected. Therefore, the employment is effective in preventing the coloring agent from diffusing into liquid crystals. Moreover, the employment is effective also in preventing the coloring agent from diffusing and crystallizing to increase in particle size and lower contrast.

As the basis for the effects of the above-mentioned condition that the decrease of the transmittance of the base polymer is 2% or less at a thickness of the base polymer of about 1 μm in the visible region (wavelength: 400 nm to 800 nm), the following data can be presented.

The transmittance in the visible region (wavelength: 400 nm to 800 nm) of acrylic resins used in conventional color filters is changed by about 5% to about 10%. In particular, the transmittance at 400 nm is about 90%. This fact means that the transmittance for blue color is decreased. Specifically, the above change of the transmittance corresponds to a 2% to 3% loss of the light transmittance of a liquid crystal display. Therefore, limiting the decrease of the transmittance to 2% or less in the visible region improves the light transmittance of the liquid crystal display and is finally effective in reducing the electric power consumption.

The tetracarboxylic acid dianhydride used in the present embodiment includes, for example, tetracarboxylic acid dianhydrides of chain alkanes, such as butanetetracarboxylic acid dianhydride, n-hexanetetracarboxylic acid dianhydride, etc.; and alicyclic tetracarboxylic acid dianhydrides such as cyclopentanetetracarboxylic acid dianhydride, cyclobutane-tetracarboxylic acid dianhydride, bicyclo[2,2,2]octanetetracarboxylic acid dianhydride, 1,4-cyclohexanedicarboxylic acid, etc. In addition, structures containing an aromatic ring or two or more non-conjugated aromatic rings are also effective. Tetracarboxylic acid dianhydrides having such a structure include, for example, methylpyromellitic dianhydride, 3,3',4,4'-diphenylmethanetetracarboxylic acid dianhydride, 3,3',4,4'-diphenyl ether tetracarboxylic acid dianhydride and 3,3',4,4'-diphenyl sulfone tetracarboxylic acid dianhydride. Fluorine-substituted derivatives of these compounds are also effective.

The diamine derivative used in the present invention includes, for example, chain alkane diamine derivatives such as 1,6-diaminohexane, 1,8-diamino-octane, 1,10-diaminodecane, 1,12-diaminododecane, etc.; and alicyclic diamine derivatives such as diaminocyclobutane, diaminocyclopentane, diaminocyclohexane, diaminodecalin, diaminobicyclo[2,2,2]octane, etc. In addition, structures containing an aromatic ring or two or more non-conjugated aromatic rings are also effective. Diamine derivatives having such a structure include, for example, 4,4'-diaminodiphenyl ether, 3,3'-diaminodiphenyl ether, 4,4'-diaminodiphenylmethane, 3,3'-diaminodiphenylmethane, 4,4'-diaminodiphenylpropane, 3,3'-diaminodiphenylpropane, 4,4'-diaminodiphenyl sulfone and 3,3'-diaminodiphenyl sulfone.

Although the tetracarboxylic acid dianhydride and diamine derivative used for synthesizing the polyamicacid which is transparent in the visible region (wavelength: 400 nm to 800 nm) are explained above by giving specific examples, they are not limited to the above-exemplified tetracarboxylic acid dianhydrides and diamine derivatives so long as the polyamicacid has a transmittance of 98% or more in the visible region (wavelength: 400 nm to 800 nm).

As the coloring agent(s) used in the present invention, there can be exemplified pigment derivatives having a structure represented by the following general formula (I):

$$A(B)_x(C)_y \quad (I)$$

wherein x is a number of 0 to 4; Y is a number of 0 to 8; A is a coloring group derived from quinacridone, anthraquinone, dianthraquinone, perylene, indigo, quinophthalone, indanthrone, isoindolinone, isoindoline, dioxazine or diketopyrrolopyrrole; B is a substituent bonded to a nitrogen atom contained in A, by the formation of a carbamate, namely, B is represented by the following structural formula (1):

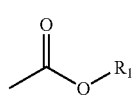

(1)

wherein $R_1$ is selected from alkyl groups and substituted aryl groups (as to the substituent for B, there is a detailed description in Protective Groups in Organic Synthesis, John Wiley & Sons, p. 223 (1981)); and C is a side chain group bonded to an aromatic ring contained in A and is selected from hydrogen atom, halogen atoms (e.g. chlorine atom), cyano group, alkyl groups (—$(CH_2)_nCH_3$ wherein n is an integer of 0 to 20), alkoxyl groups (—O—$(CH_2)_mCH_3$ wherein m is an integer of 0 to 20) and oxymethylene groups (—O—$(CH_2—O)_kCH_3$ wherein k is an integer of 0 to 20), and of these, the alkyl groups and the alkoxyl groups may contain a functional group for polymerization and addition, such as a vinyl group, epoxy group or the like.

Such introduction of a side chain group such as C makes it possible to increase the solubility of the coloring agent. In addition, by introducing a functional group for polymerization and addition, such as a vinyl group, epoxy group or the like into the alkyl group or alkoxyl group selected as the side chain group, the coloring agent can be prevented from diffusing as molecules into liquid crystals. This introduction is effective also in preventing the coloring agent from diffusing and crystallizing to increase in particle size and lower contrast.

As an example of the coloring agent used in the present embodiment, a diketopyrrolopyrrole derivative is explained below in detail with reference to the structural formulas (4-1), (4-2) and (4-3):

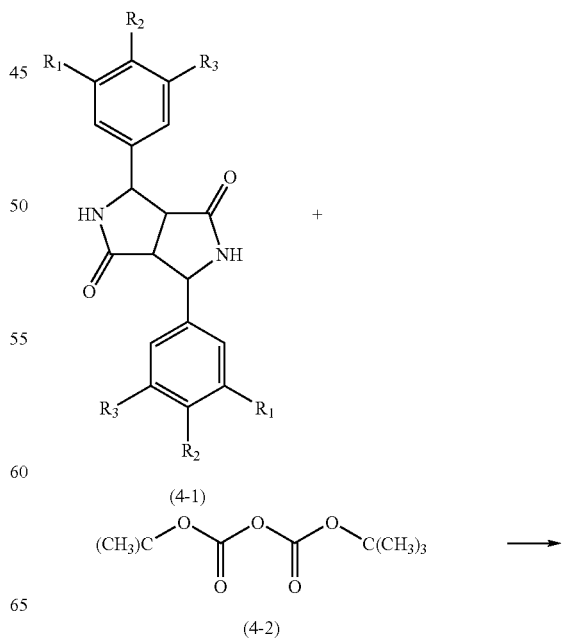

-continued

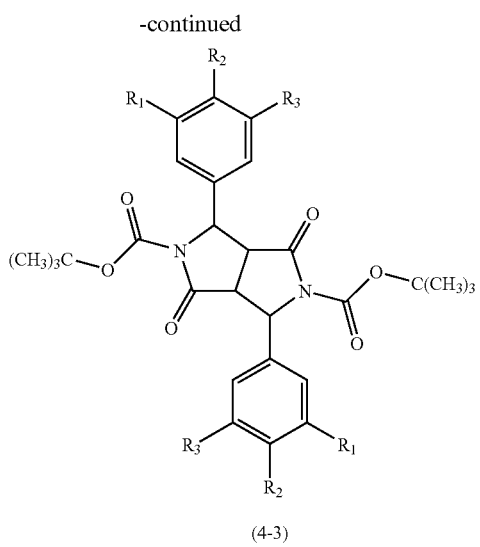

(4-3)

The diketopyrrolopyrrole derivative of the structural formula (4-3) can easily be synthesized by the reaction of a diketopyrrolopyrrole (Pigment Red 254) of the structural formula (4-1) with di-t-butyl carbonate of the structural formula (4-2).

As the coloring group of the coloring agent used in the present embodiment, an indigo represented by the following structural formula (5) may be used besides the above-mentioned diketopyrrolopyrrole:

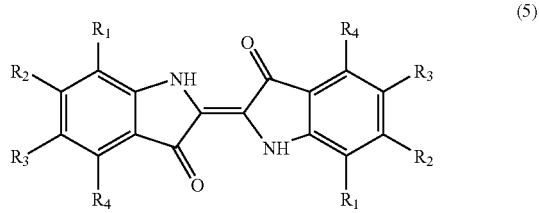
(5)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—$(CH_2)_n CH_3$ wherein n is an integer of 0 to 20), alkoxyl groups (—O—$(CH_2)_m CH_3$ wherein m is an integer of 0 to 20) and oxymethylene groups (—O—$(CH_2$—$O)_k CH_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, a perylene derivative represented by the following structural formula (6) may be used:

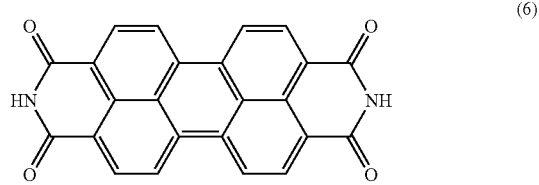
(6)

As the coloring group of the coloring agent used in the present embodiment, a quinacridone represented by the following structural formula (7) may be used:

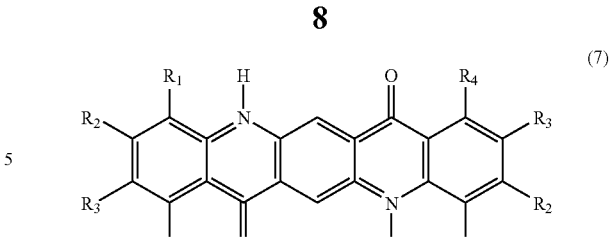
(7)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—$(CH_2)_n CH_3$ wherein n is an integer of 0 to 20), alkoxyl groups (—O—$(CH_2)_m CH_3$ wherein m is an integer of 0 to 20) and oxymethylene groups (—O—$(CH_2$—$O)_k CH_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, an indanthrone represented by the following structural formula (8) may be used:

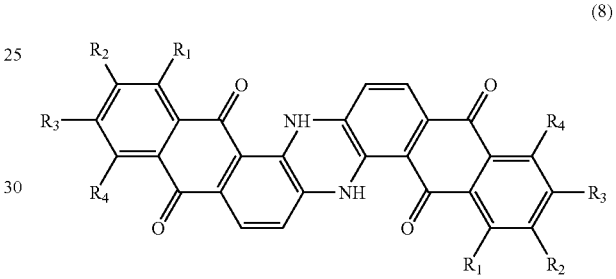
(8)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—$(CH_2)_n CH_3$ wherein n is an integer of 0 to 20), alkoxyl groups (—O—$(CH_2)_m CH_3$ wherein m is an integer of 0 to 20) and oxymethylene groups (—O—$(CH_2$—$O)_k CH_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, a dianthraquinone represented by the following structural formula (9) may be used:

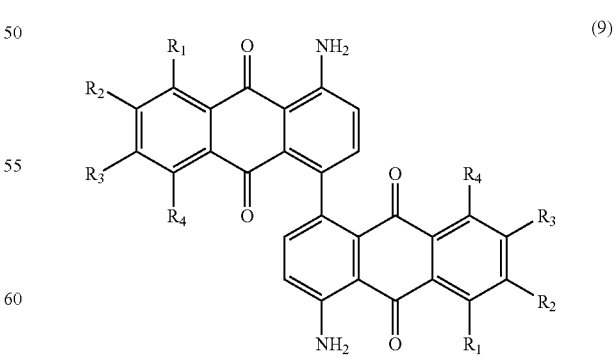
(9)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—(CH$_2$)$_n$CH$_3$ wherein n is an integer of 0 to 20), alkoxyl groups (—O—(CH$_2$)$_m$CH$_3$ wherein m is an integer of 0 to 20) and oxymethylene groups (—O—(CH$_2$—O)$_k$CH$_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, a dioxazine represented by the following structural formula (10) may be used:

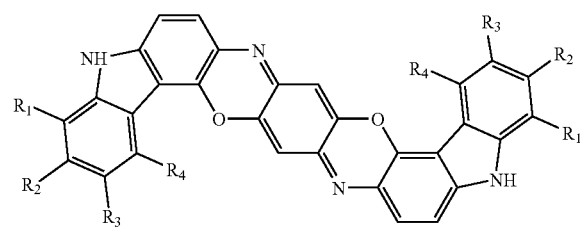

(10)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—(CH$_2$)$_n$CH$_3$ wherein n is an integer of 0 to 20), alkoxyl groups (—O—(CH$_2$)$_m$CH$_3$ wherein m is an integer of 0 to 20) and oxymethylene groups (—O—(CH$_2$—O)$_k$CH$_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, an isoindoline represented by the following structural formula (11) may be used:

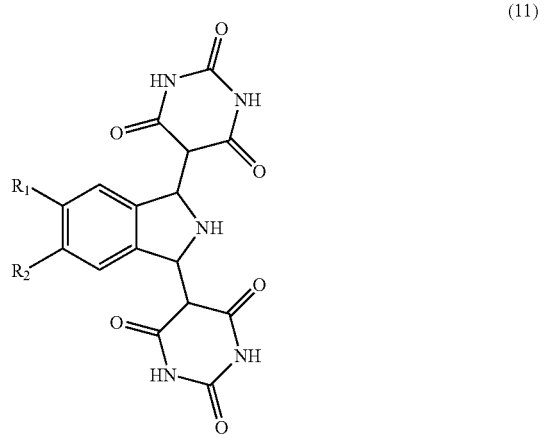

(11)

wherein each of $R_1$ and $R_2$ is a side chain group bonded to the aromatic ring and is selected from hydrogen atom, halogen atoms (e.g. chlorine atom), cyano group, alkyl groups (—(CH$_2$)$_n$CH$_3$ wherein n is an integer of 0 to 20), alkoxyl groups (—O—(CH$_2$)$_m$CH$_3$ wherein m is an integer of 0 to 20) and oxymethylene groups (—O—(CH$_2$—O)$_k$CH$_3$ wherein k is an integer of 0 to 20), and of these, the alkyl groups and the alkoxyl groups may contain a functional group for polymerization and addition, such as a vinyl group, epoxy group or the like.

As the coloring group of the coloring agent used in the present embodiment, a dioxazine derivative represented by the following structural formula (12) may be used:

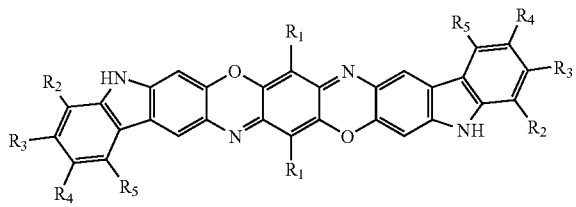

(12)

wherein each of $R_1$, $R_2$, $R_3$ and $R_4$ is a side chain group bonded to each aromatic ring and is selected from hydrogen atom, halogen atoms (e.g. chlorine atom), cyano group, alkyl groups (—(CH$_2$)$_n$CH$_3$ wherein n is an integer of 0 to 20), alkoxyl groups (—O—(CH$_2$)$_m$CH$_3$ wherein m is an integer of 0 to 20) and oxymethylene groups (—O—(CH$_2$—O)$_k$CH$_3$ wherein k is an integer of 0 to 20), and of these, the alkyl groups and the alkoxyl groups may contain a functional group for polymerization and addition, such as a vinyl group, epoxy group or the like.

As the coloring agent(s) used in the present embodiment, there can be exemplified phthalocyanine derivatives having a structure represented by the following general formula (II):

$$Pc(M)(C)_y(D)_z \qquad (II)$$

wherein y is a number of 0 to 16; z is a number of 0 to 2; PC is phthalocyanine; M is H$_2$, Ni, Zn, Cu, Fe, V, Ti, Si or Ge; C is a side chain group bonded to an aromatic ring contained in A and is a hydrogen atom, a chlorine atom, an alkyl group (—(CH$_2$)$_n$CH$_3$ wherein n is a number of 0 to 20), an alkoxyl group (—O—(CH$_2$)$_m$CH$_3$ wherein m is a number of 0 to 20), an oxymethylene group (—O—(CH$_2$—O)$_k$CH$_3$ wherein k is a number of 0 to 20) or an alkoxysilane residue (—Si(—O—(CH$_2$)$_m$CH$_3$)$_3$ wherein m is an integer of 0 to 20), and of these, the alkyl group and the alkoxyl group may contain a functional group for polymerization and addition, such as a vinyl group, epoxy group or the like; and D is a substituent bonded to M and having an oxygen atom as a spacer, namely, D is represented by the following structural formula (2):

(2)

As the coloring agent of the general formula (II) used in the present embodiment, a phthalocyanine derivative represented by the following structural formula (13) may be used:

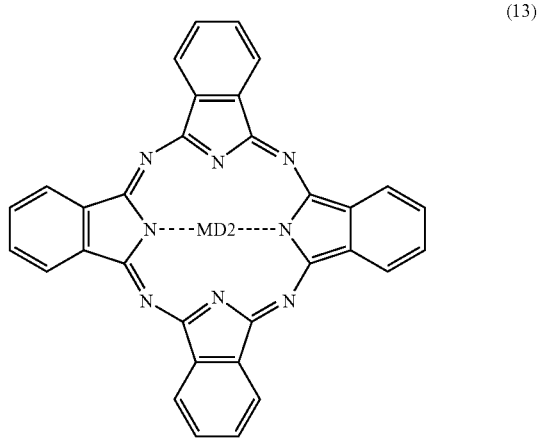

(13)

wherein M is H$_2$, Ni, Zn, Cu, Fe, V, Si or Ge; and D is a substituent bonded to M and having an oxygen atom as a spacer, namely, D is represented by the following structural formula (2):

As the coloring agent used in the present embodiment, a phthalocyanine derivative represented by the following structural formula (14) may be used:

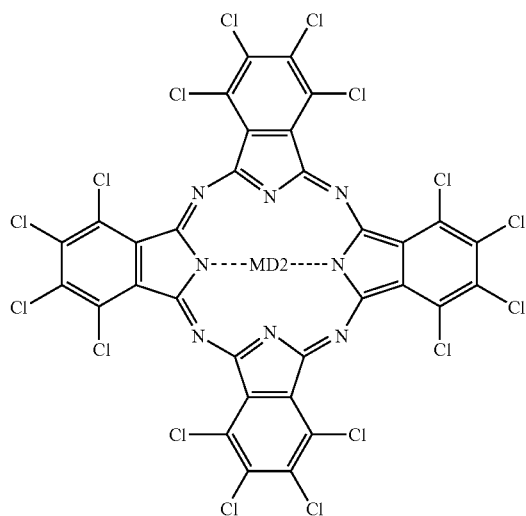

wherein M is $H_2$, Ni, Zn, Cu, Fe, V, Si or Ge; and D is a substituent bonded to M and having an oxygen atom as a spacer, namely, D is represented by the following structural formula (2):

As the coloring agent used in the present embodiment, a phthalocyanine derivative represented by the following structural formula (15) may be used:

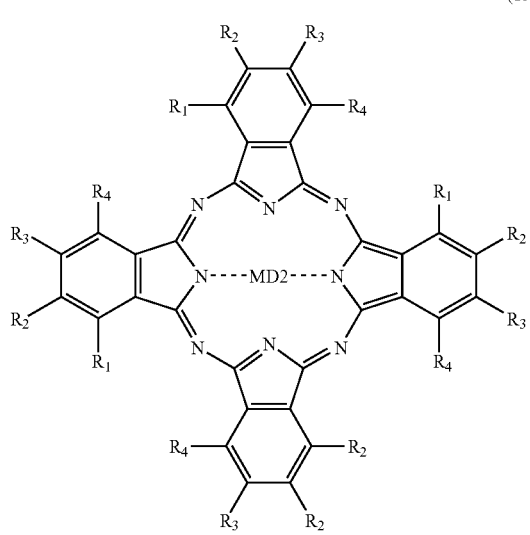

wherein M is $H_2$, Ni, Zn, Cu, Fe, V, Si or Ge; each of $R_1$, $R_2$, $R_3$ and $R_4$ is a side chain group bonded to each aromatic ring and is a hydrogen atom, a chlorine atom, an alkyl group (—$(CH_2)_n CH_3$ wherein n is a number of 0 to 20), an alkoxyl group (—O—$(CH_2)_m CH_3$ wherein m is a number of 0 to 20), an oxymethylene group (—O—$(CH_2—O)_k CH_3$ wherein k is a number of 0 to 20) or an alkoxysilane residue (—Si(—O—$(CH_2)_m CH_3)_3$ wherein m is an integer of 0 to 20), and of these, the alkyl group and the alkoxyl group may contain a functional group for polymerization and addition, such as a vinyl group, epoxy group or the like; and D is a substituent bonded to M and having an oxygen atom as a spacer, namely, D is represented by the following structural formula (2):

Although the coloring agent(s) is explained above by giving specific examples, the coloring agent(s) is not particularly limited to the above-exemplified coloring agents so long as it is a pigment derivative soluble in a solvent for the polyamicacid. This is explained with reference to the following structural formula (2).

As a solvent(s) for the base polymer and coloring agent used in the present embodiment, there can be used solvents having a solubility parameter of 10 $(cal/cm^3)^{0.5}$ or more, such as N-methylpyrrolidone, dimethylformamide, dimethylacetamide, dimethyl sulfoxide, sulufolane, γ-butyrolactone, cresol, phenol, cyclohexanone, dioxane, tetrahydrofuran, ethylene glycol monobutyl ether, ethylene glycol monobutyl ether acetate, acetophenone, etc. In addition, solvents having a solubility parameter of 11 $(cal/cm^3)^{0.5}$ or more are more preferable from the viewpoint of the solubility of the base polymer and the coloring agent(s). The above-exemplified solvents may be used singly or in combination.

Thus, a solvent having a solubility parameter of 10 $(cal/cm^3)^{0.5}$ or more has to be used for dissolving the polyamicacid as base polymer, and the selection of such a solvent having a solubility parameter of 10 $(cal/cm^3)^{0.5}$ or more, preferably 11 $(cal/cm^3)^{0.5}$ or more, is preferable for dissolving the above-mentioned coloring agent(s) in an amount of 5 wt % or more and demands primary consideration in the production of color filters.

Specific embodiments of the colored composition for color filter of the present invention, a process for production of color filters, and a display using the color filters are explained below in detail.

Embodiment of a Colored Composition for Color Filter—1

The colored composition for color filter according to this embodiment is composed of the following base polymer, coloring agent and solvent.

Base polymer: a polyamicacid of the structural formula (3-3) in which $R_2$ is cyclobutane and $R_3$ is a hexyl group [10 wt %].

Coloring agent: a diketopyrrolopyrrole derivative of the structural formula (4-3) in which each of $R_1$ and $R_2$ is a hydrogen atom and $R_3$ is a cyano group [5 wt %].

Solvent: N-methylpyrrolidone [85 wt %].

A cyclobutanetetracarboxylic acid dianhidride of the structural formula (3-1) in which $R_2$ is cyclobutane and a hexyldiamine of the structural formula (3-2) in which $R_3$ is a hexyl group were subjected to ring-opening polyaddition in 60 g of N-methylpyrrolidone to obtain 10 g of the polyamicacid. After the synthesis, the reaction solution was filtered through Millipore Filter of 0.5 μm. To the filtrate were added 5 g of the diketopyrrolopyrrole derivative and then 25 g of N-methylpyrrolidone to obtain a red colored composition for color filter. The employment of N-methylpyrrolidone made it possible to dissolve the coloring agent to such an extent that a sufficient coloring density could be attained.

Embodiment of a Colored Composition for Color Filter—2

The colored composition for color filter according to this embodiment is composed of the following base polymer, coloring agents and solvents.

Base polymer: a polyamicacid of the structural formula (3-3) in which $R_2$ is cyclobutane and $R_3$ is a hexyl group [10 wt %].

Coloring agent 1: a phthalocyanine derivative of the structural formula (14) in which M is copper and D is absent [4.5 wt %].

Coloring agent 2: a phthalocyanine derivative of the structural formula (14) in which M is silicon and D is an ethoxy group [0.5 wt %].

Solvent 1: N-methylpyrrolidone [44 wt %].
Solvent 2: γ-butyrolactone [41 wt %].

A cyclobutanetetracarboxylic acid dianhydride of the structural formula (3-1) in which $R_2$ is cyclobutane and a hexyldiamine of the structural formula (3-2) in which $R_3$ is a hexyl group were subjected to ring-opening polyaddition in a mixed solvent of 24 g of N-methylpyrrolidone and 40 g of γ-butyrolactone to obtain 10 g of the polyamicacid. After the synthesis, the reaction solution was filtered through Millipore Filter of 0.5 μm. To the filtrate were added 5 g each of the phthalocyanine derivatives as the coloring agent 1 and the coloring agent 2 and then 20 g of N-methylpyrrolidone to obtain a green colored composition for color filter. Owing to the effect of the sufficient dissolution of the coloring agent 1 in the solvent for the polyamicacid, the dispersibility of the coloring agent 2 was improved.

Embodiment of a Colored Composition for Color Filter—3

The colored composition for color filter according to this embodiment is composed of the following base polymer, coloring agents and solvent.

Base polymer: a polyamicacid of the structural formula (3-3) in which $R_2$ is cyclobutane and $R_3$ is a hexyl group [10 wt %].

Coloring agent 1: a phthalocyanine derivative of the structural formula (13) in which M is copper and D is absent [4.5 wt %].

Coloring agent 2: a phthalocyanine derivative of the structural formula (15) in which each of $R_1$, $R_2$ and $R_3$ is a hydrogen atom, $R_4$ is a propyl group, M is copper and D is absent [0.5 wt %].

Solvent 1: N-methylpyrrolidone [84 wt %].

A cyclobutanetetracarboxylic acid dianhydride of the structural formula (3-1) in which $R_2$ is cyclobutane and a hexyldiamine of the structural formula (3-2) in which $R_3$ is a hexyl group were subjected to ring-opening polyaddition in a mixed solvent of 24 g of N-methylpyrrolidone and 40 g of γ-butyrolactone to obtain 10 g of the polyamicacid. After the synthesis, the reaction solution was filtered through Millipore Filter of 0.5 μm. To the filtrate were added 5 g each of the phthalocyanine derivatives as the coloring agent 1 and the coloring agent 2 and then 20 g of N-methylpyrrolidone to obtain a blue colored composition for color filter. It was confirmed that owing to the effect of the sufficient dissolution of the coloring agent 1 in the solvent for the polyamicacid, the dispersibility of the coloring agent 2 had been improved.

Embodiment of a Process for Production of Color Filters—1

In the process for production of color filters according to this embodiment, there was used a 1.1-mm-thick transparent glass substrate with polished surfaces having substrate sizes of 320 mm (long side)×240 mm (short side) and a display portion of 15-inch size (a nominal width across corners). After a black matrix was formed on the glass substrate, the red colored composition for color filter described in "Embodiment of a colored composition for color filter—1" was applied thereon by screen printing. After the application, the red colored composition for color filter was dried and then heated at 200° C. to convert the polyamicacid to polyimide. In this case, the yellow color of the composition after the application and drying was changed to red color by the heating. Thereafter, the same procedure as above was repeated except for using each of the green colored composition and the blue colored composition described in "Embodiment of a colored composition for color filter—2" and "Embodiment of a colored composition for color filter—3", respectively.

Thus, owing to the employment of the polyamicacid, a conventional vacuum irradiator for photo-etching became unnecessary, so that a marked reduction of the production cost has become possible.

Embodiment of a Process for Production of Color Filters—2

In the process for production of color filters according to this embodiment, there was used a 1.1-mm-thick transparent glass substrate with polished surfaces having substrate sizes of 320 mm (long side)×240 mm (short side) and a display portion of 15-inch size (a nominal width across corners). After a black matrix was formed on the glass substrate, the red, green and blue colored compositions for color filter described in "Embodiment of a colored composition for color filter—1", "Embodiment of a colored composition for color filter—2" and "Embodiment of a colored composition for color filter—3", respectively, were pored onto and applied on the corresponding portions of the black matrix at the same time by ink jet printing. After the application, the compositions were dried and then heated at 200° C. to convert the polyamicacid to polyimide.

Thus, owing to the employment of the polyamicacid, there could be obtained the colored compositions for color filter which were excellent in the solubility and dispersibility of their components, and it has become possible to conduct printing without clogging which tends to be caused in ink jet printing. A conventional vacuum irradiator for photo-etching became unnecessary, so that a marked reduction of the production cost has become possible. Moreover, since the red, green and blue color filters could be formed at the same time, the process could be greatly shortened.

Embodiment of a Process for Production of Color Filters—3

In the process for production of color filters according to this embodiment, a pixel electrode substrate was used. There was used a 1.1-mm-thick transparent glass substrate with polished surfaces having pixel electrode substrate sizes of 320 mm (long side)×240 mm (short side) and a display portion of 15-inch size (a nominal width across corners). Common electrodes, signal electrodes, pixel electrodes and the like were formed on the glass substrate to obtain the pixel electrode substrate.

The red, green and blue colored compositions for color filter described in "Embodiment of a colored composition for color filter—1", "Embodiment of a colored composition for color filter—2" and "Embodiment of a colored composition for color filter—3", respectively, were pored onto and applied on the corresponding pixels of the pixel electrode substrate at the same time by ink jet printing. After the application, the compositions were dried and then heated at 200° C. to convert the polyamicacid to polyimide.

Thus, owing to the employment of the polyamicacid, there could be obtained the colored compositions for color filter which were excellent in the solubility and dispersibility of their components, and it has become possible to conduct printing without clogging which tends to be caused in ink jet printing. A conventional vacuum irradiator for photo-etching became unnecessary, so that a marked reduction of the production cost has become possible. Moreover, since the red, green and blue color filters could be formed at the same time, the process could be greatly shortened.

Furthermore, since the color filters were directly formed on the pixel electrode substrate to obtain a lower substrate, the alignment of the lower substrate with an upper substrate becomes easy.

Embodiment of a Display—1

In the liquid crystal display according to this embodiment, the color filter substrate SUB 2 described in "Embodiment of a process for production of color filters—2" was used as a first substrate (an upper substrate) and the pixel electrode substrate SUB1 described below was used as a second substrate (a lower substrate). There was used a 1.1-mm-thick transparent glass substrate with polished surfaces having pixel electrode substrate SUB1 sizes of 320 mm (long side)×240 mm (short side) and a display portion of 15-inch size (a nominal width across corners). Common electrodes, signal electrodes, pixel electrodes and the like were formed on the glass substrate, and an alignment layer was formed on the outermost surface of the thus treated glass substrate. The same alignment layer as above was formed on the color filter substrate described in "Embodiment of a process for production of color filters—2". A polyimide was used as the alignment layers. The polyimide was applied with a printer so that its thickness after baking might be approximately 0.07 μm to 0.1 μm. Then, the surfaces of the alignment layers were subjected to alignment treatment for orientation of liquid crystals. The alignment treatment was carried out with a rubbing machine by using rayon buff on rubbing rolls.

The upper and lower substrates were adhered to each other as follows. A proper amount of polymer beads were mixed with a sealing agent (an epoxy resin) and the resulting mixture was printed on the substrates by the use of a seal mask. Then, the sealing agent was tentatively cured to combine the upper and lower substrates. Thereafter, the sealing agent was cured while pressing the two substrates by the use of a press. Inside the panel surface, spherical polymer beads were held between the substrates so that the size of the gap between them for a liquid crystal layer might be 6.0 μm when liquid crystals were enclosed in the gap. The angle of rubbing for the alignment layers was 45° to the short side of each substrate, and the direction of rubbing on the upper substrate was perpendicular to that on the lower substrate. The width of an opening for injecting liquid crystals was 30 mm. Subsequently, liquid crystals were injected into the gap with a liquid crystal injector to produce a liquid crystal display. In this case, columnar spacers fixed on the substrate surfaces by photolithography may also be used in place of the beads. This applies also to the following embodiments.

Although a conventional cold-cathode tube was used as a backlight in the present embodiment, the contrast was improved by about 10% as compared with conventional liquid crystal displays, in spite of the cold-cathode tube because the transparent polyamicacid had been used as a base polymer in the color filter substrate. In addition, the transmittance at a wavelength of 400 nm was improved by 5% or more. An embodiment of a liquid crystal display as an example of the display of the present invention is explained below.

Figure 2:
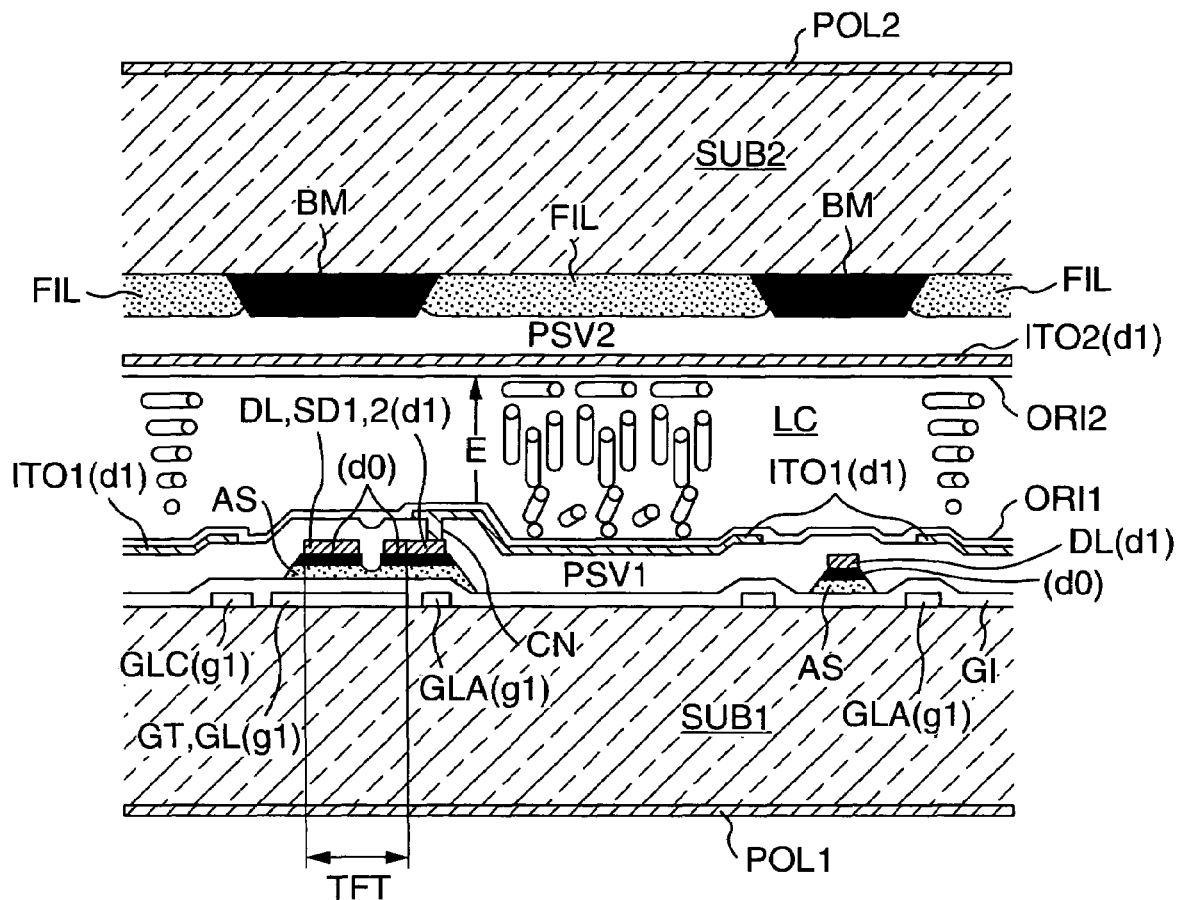
FIG. 2 is a cross-sectional view taken along the line A-A' of FIG. 1.

FIG. 1 is a cross-sectional view schematically illustrating the structure near one pixel of a liquid crystal panel constituting the liquid crystal display as an example of the display of the present invention. FIG. 2 is a cross-sectional view taken along the line A-A' of FIG. 1. The reference symbols are as follows: TFT denotes a thin-film transistor, DL a drain line (a picture signal line), GL, GLA and GLC gate lines (scanning signal lines), AS a semiconductor layer, GT a gate electrode, SD1 a source electrode, SD2 a drain electrode, PX a pixel electrode, and CN a contact hole.

In addition, GI denotes a gate insulating film, PSV1 and PSV2 insulating protective films, ITO1 a transparent electroconductive film constituting a pixel electrode PX, ORI1 an alignment layer on the first substrate side, i.e., the pixel electrode substrate SUB1 side, ORI2 an alignment layer on the second substrate side, i.e., the color filter substrate SUB2 side, LC a liquid crystal layer (liquid crystal composition layer), and E an electric field. BM denotes a black matrix, FIL a color filter, and ITO2 a counter electrode. The reference symbols marked with denote the components of an adjacent pixel. The parenthesized symbols (0, d1 and g1) denote constituent layers, namely, members accompanied with the same parenthesized symbol are formed of the same constituent layer.

In the liquid crystal display panel according to the present embodiment, when a thin-film transistor TFT for a pixel selected by a scanning line, i.e., a gate line and a drain line as signal line or data line assumes an "on" state, an electric field E is formed between the pixel electrode PX (ITO1) connected to the source electrode SD1 and the counter electrode ITO2 on the color filter substrate SUB2 side. Owing to this electric field, molecules of a liquid crystal composition constituting the liquid crystal layer LC stand up, and light for illumination introduced from the deflector POL1 of the first substrate SUB1 comes out of the deflector POL2 of the second substrate SUB2.

Figure 3:
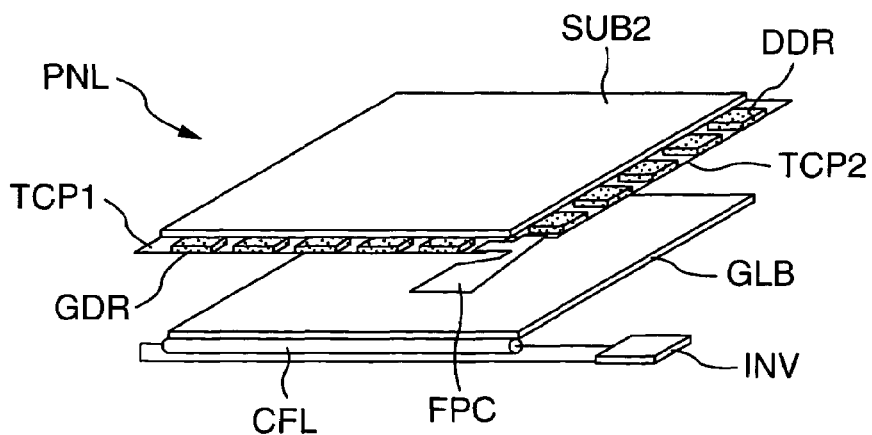
FIG. 3 is a perspective view schematically illustrating an outline of the whole structure of one embodiment of a liquid crystal display according to the present invention.

FIG. 3 is a perspective view schematically illustrating an outline of the whole structure of one embodiment of a liquid crystal display according to the present invention. A tape carrier package TCP1 mounted with scanning line driving circuit (gate line driving circuit or gate driving circuit) chips GDR is connected to one side of one of the substrates (usually the first substrate) of a liquid crystal display panel PNL. A tape carrier package TCP2 mounted with signal line driving circuit (drain line driving circuit, drain driving circuit or data line driving circuit) chips GDR is connected to another side adjacent to the above-mentioned side.

The tape carrier package TCP2 is connected to the tape carrier package TCP1 on the gate side by a flexible printed circuit board FPC and is connected also to an interface circuit board (not shown). The individual driving circuit chips may be directly mounted on the corresponding side of the first substrate in place of the tape carrier package TCP1 and the tape carrier package TCP2.

A backlight composed of a light-guiding plate GLB and a linear lamp CFL such as a cold-cathode fluorescent lamp (a cold-cathode tube) is set at the back of the liquid crystal display panel PNL. The linear lamp CFL is driven by an inverter INV. The liquid crystal display panel PNL and the backlight are held by an upper case (not shown) and a lower case (not shown) to be made into a product as a so-called liquid crystal display module, i.e., a liquid crystal display. A plurality of cold-cathode tubes may be directly set at the back of the liquid crystal display panel as a backlight without using the light-guiding plate GLB.

Embodiment of a Display—2

This embodiment is an organic light emission display. The same color filter substrate as described as a second substrate in "Embodiment of a display—1" was used as an upper substrate and the following organic light-emitting pixel substrate as a second substrate was used as a lower substrate. There was used a 1.1-mm-thick transparent glass substrate with polished surfaces having organic light-emitting pixel substrate sizes of 320 mm (long side)×240 mm (short side) and a display portion of 15-inch size (a nominal width across corners). Common electrodes, signal electrodes, white organic light-emitting pixels and the like were formed on the glass substrate. The upper and lower substrates were adhered to each other as follows. A proper amount of polymer beads were mixed with a sealing agent (an epoxy resin) and the resulting mixture was printed on the substrates by the use of a seal mask. Then, the sealing agent was tentatively cured to combine the upper and lower substrates.

Figure 4:
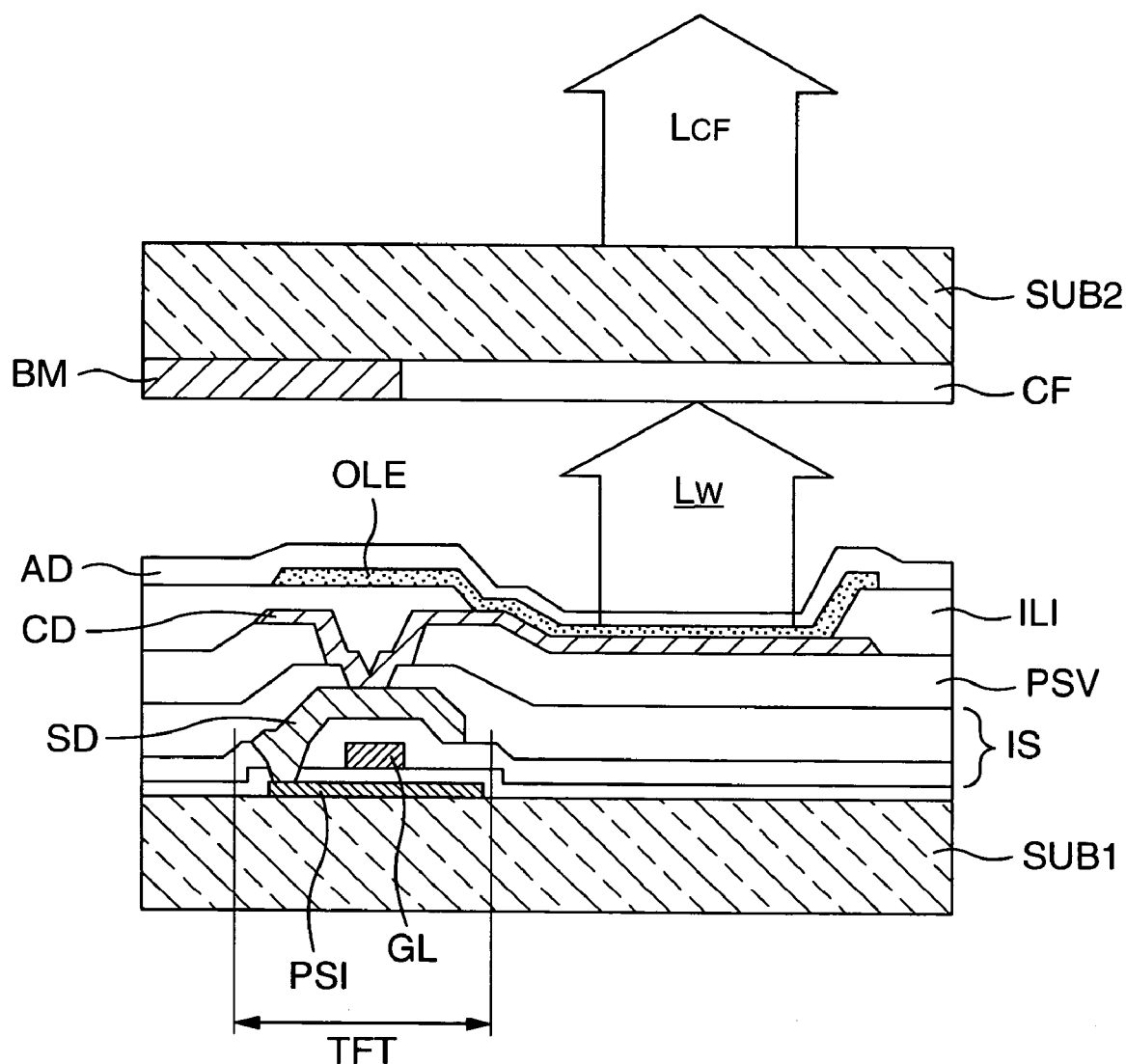
FIG. 4 is a cross-sectional view schematically illustrating the structure near one pixel of an organic light emission panel constituting an organic light emission display as another example of the display of the present invention.

FIG. 4 is a cross-sectional view illustrating the structure near one pixel of an organic light emission panel constituting an organic light emission display as another example of the display of the present invention. In this example, a thin-film transistor composed of a semiconductor layer PSI, a scanning line (i.e. a gate line) GL insulated with an insulating layer IS or PSV, and a sources drain electrode SD is formed on the first substrate, i.e., the organic light-emitting pixel substrate. A first electrode layer (in this case, a cathode) CD formed of a thin metal film is connected to the source drain electrode SD, and an organic light-emitting layer OLE capable of emitting white light is formed over the first electrode CD. In addition, a second electrode layer (in this case, an anode) AD formed of a transparent electroconductive film such as ITO is formed on the organic light-emitting layer OLE.

On the other hand, the second substrate, i.e., the color filter substrate SUB2 is made of transparent glass and has red, green and blue color filters CF formed in its inner surface which are divided according to a black matrix BM and are arranged so as to correspond to pixels, respectively, of the organic light-emitting layer present in the first substrate. In the organic light emission display, emitted light LW comes out in the direction of the second substrate SUB2, namely, light LW emitted by the organic light-emitting layer OLE comes out toward the second substrate SUB2 from the second electrode layer AD. This emitted light LW is converted to light LCF of a predetermined color by each of the above-mentioned color filters CF of the present invention formed in the inner surface of the second substrate SUB2, and then comes out toward an observer.

Figure 5:
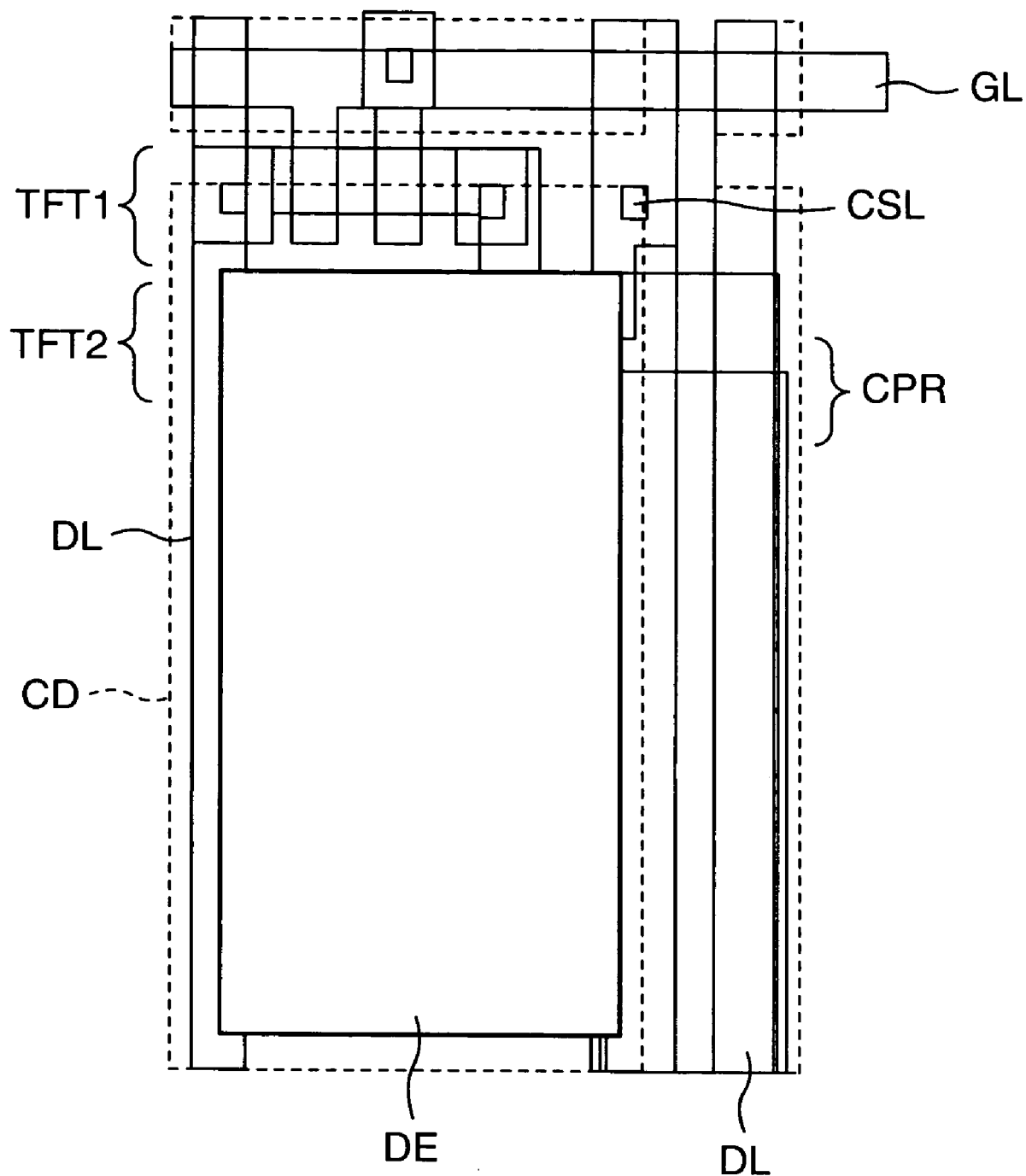
FIG. 5 is a plan view of the vicinity of one pixel which illustrates one example of the structure of circuit of the display of the present invention shown in FIG. 4.

FIG. 5 is a plan view of the vicinity of one pixel which illustrates one example of the structure of circuit of the display of the present invention shown in FIG. 4. The pixel is formed in a region surrounded by a gate line GL and a drain line DL.

In this display, an opening DE for accommodating an organic light-emitting layer OLE need not be formed in a portion other than a pixel circuit having a thin-film transistor and various wirings, so that pixels having a high aperture ratio and a large area can be formed. Therefore, a display having a collectively bright picture can be obtained. Moreover, there can be obtained an organic light emission display that consumes a lower electric power and has a longer life though it has the same brightness.

Figure 6:
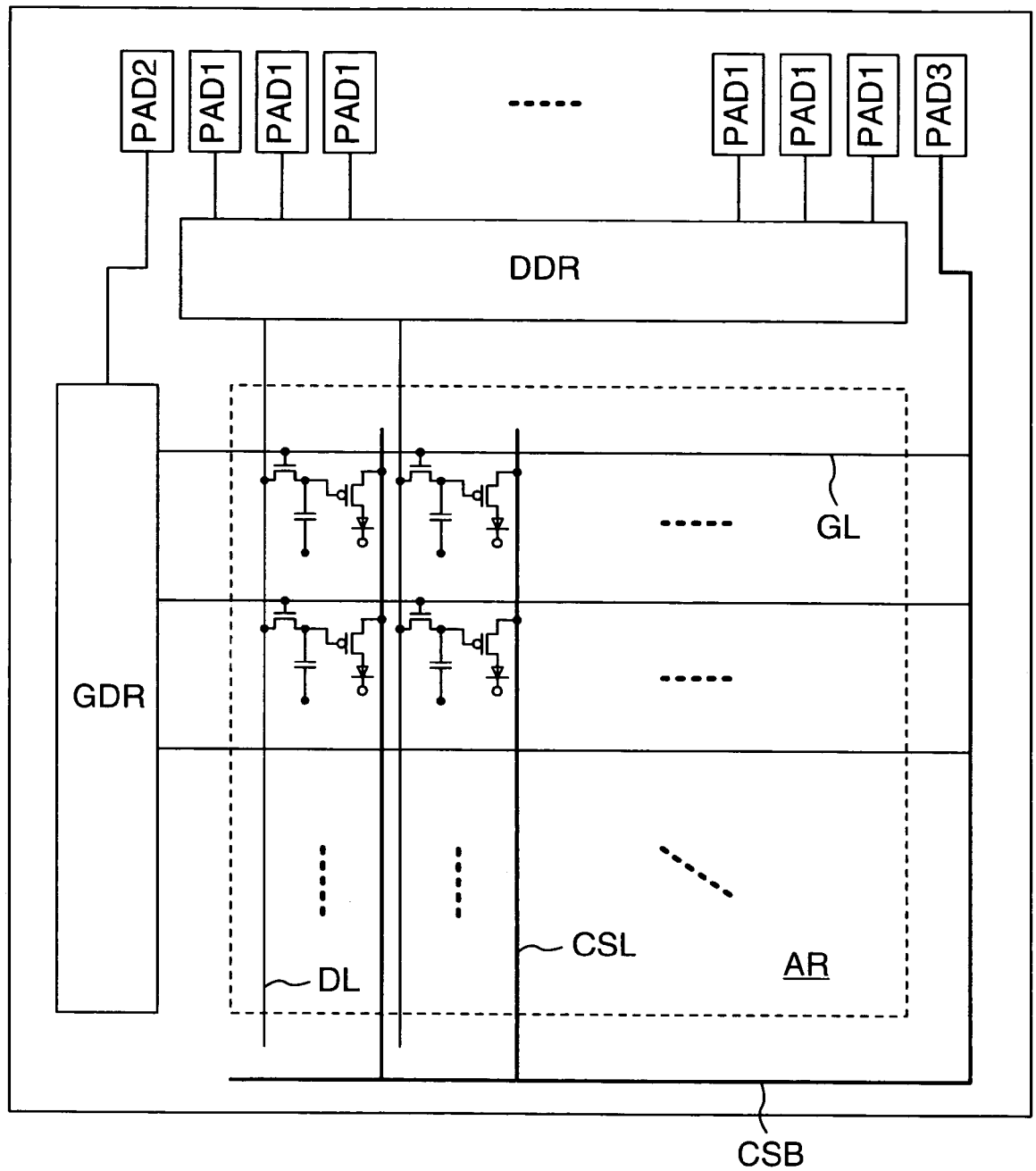
FIG. 6 is a plan view schematically illustrating one example of the arrangement of circuits in an organic light emission display using the pixels shown in FIG. 5.

FIG. 6 is a plan view schematically illustrating one example of the arrangement of circuits in an organic light emission display using the pixels shown in FIG. 5. Each pixel is formed in a portion surrounded by a gate line GL driven by a scanning driving circuit GDR and a drain line (a data line) DL driven by a signal line driving circuit DDR, and the pixels are arranged in the form of a matrix. Current-supplying lines CSL branch off from a current-supplying bus line CSB outside a display region AR and are set for the pixels, respectively, in parallel with the drain lines DL.

The symbol PAD denotes a pad for supplying signals and electric power to the organic light emission display from the outside through a flexible printed circuit board or the like. The symbol PAD1 denotes a pad for data driving circuit, the symbol PAD2 a pad for scanning driving circuit, and the symbol PAD2 a pad for current supply. Also in each of these pads, an opening is formed in the insulating layer or protective film of the pad.

In the organic light emission display, since the transparent polyamicacid was thus used as a base polymer for the color filters formed in the color filter substrate SUB2, the contrast was improved by 5% or more as compared with conventional organic light emission displays.

Embodiment of a Display—3

This embodiment is a liquid crystal display. The same color filter substrate as described in "Embodiment of a display—1" was used as an upper substrate and the pixel electrode substrate described below was used as a lower substrate (pixel electrode substrate). There was used a 1.1-mm-thick transparent glass substrate with polished surfaces having pixel electrode substrate sizes of 320 mm (long side)×240 mm (short side) and a display portion of 15-inch size (a nominal width across corners). Common electrodes, signal electrodes, pixel electrodes and the like were formed on the glass substrate, and an alignment layer was formed on the outermost surface of the thus treated glass substrate. The same alignment layer was formed on the same color filter substrate as described in "Embodiment of a display—1". A polyimide was used as the alignment layers. The polyimide was applied with a printer so that its thickness after baking might be approximately 0.07 μm to 0.1 μm. Then, the surfaces of the alignment layers were subjected to alignment treatment for orientation of liquid crystals. The alignment treatment was carried out with a rubbing machine by using rayon buff on rubbing rolls.

The upper and lower substrates were adhered to each other as follows. A proper amount of polymer beads were mixed with a sealing agent (an epoxy resin) and the resulting mixture was printed on the substrates by the use of a seal mask. Then, the sealing agent was tentatively cured to combine the upper and lower substrates. Thereafter, the sealing agent was cured while pressing the two substrates by the use of a press. Inside the panel surface, spherical polymer beads were held between the substrates so that the size of the gap between them might be 6.0 μm when liquid crystals were enclosed in the gap. The angle of rubbing for the alignment layers was 45° to the short side of each substrate, and the direction of rubbing on the upper substrate was perpendicular to that on the lower substrate. The width of an opening for injecting liquid crystals was 30 mm. Subsequently, liquid crystals were injected into the gap with a liquid crystal injector to produce a liquid crystal display.

In the present embodiment, a light-emitting diode (LED) was used as a backlight. The contrast and the transmittance at a wavelength of 400 nm were improved by about 10% and about 5%, respectively, as compared with liquid crystal displays using a cold-cathode tube, because of not only the effect of the employment of LED as a backlight but also the effect of the employment of the transparent polyamicacid as a base polymer in the color filter substrate. Moreover, the color purity was also improved by the employment of LED.

As explained above, according to the present invention, not only the contrast, color purity and transmittance for blue color of color filters but also the productivity of a process for production of the color filters are improved by using a polyamicacid whose light transmittance decreases by 2% or less in the visible region (wavelength: 400 nm to 800 nm), as a base polymer in a colored composition for color filter comprising the base polymer, at least one coloring agent and at least one solvent. Furthermore, a display having a high contrast, a high color purity and an improved transmittance for blue color can be provided by using such color filters.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A colored composition for color filter comprising a base polymer containing a polyamicacid whose light transmittance decreases by 2% or less in the visible region (wavelength: 400 nm to 800 nm), at least one coloring agent and at least one solvent, wherein a pigment derivative having a structure represented by the following general formula (I) is used as said coloring agent:

wherein x is a number of 1 to 4; y is a number of 0 to 8, and x+y is greater than or equal to 1; A is a coloring group derived from quinacridone, anthraquinone, perylene, indigo, quinophthalone, isoindolinone, isoindoline, dioxazine or diketopyrrolopyrrole; B is a substituent bonded to a nitrogen atom contained in A, by the formation of a carbamate, namely, B is represented by the following structural formula (1):
wherein $R_1$ is

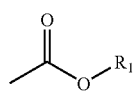

and substituted aryl groups; and C is a side chain group bonded to an aromatic ring contained in A and is selected from halogen atoms, cyano group, alkyl groups (—$(CH_2)_n$ $CH_3$ wherein n is an integer of 0 to 20), alkoxyl groups (—O—$(CH_2)_m CH_3$ wherein m is an integer of 0 to 20) and oxymethylene groups (—O—$(CH_2$—O$)_k CH_3$ wherein k is an integer of 0 to 20), and of these, the alkyl groups and the alkoxyl groups may contain a functional group for polymerization and addition.

2. A colored composition for color filter according to claim 1, wherein N-methylpyrrolidone or γ-butyrolactone, or both, are contained as said solvent(s).

3. A display comprising at least a first substrate having a plurality of scanning lines extending in a first direction and provided side by side in a second direction non-parallel to the first direction, a plurality of signal lines extending in said second direction and provided side by side in the first direction, and a plurality of color pixels forted at the intersections, respectively, of said scanning lines and said signal lines;
a second substrate having color filters of two or more colors located so as to face the plurality of said pixels, respectively;
a liquid crystal layer enclosed in a gap formed by sticking said first substrate and said second substrate to each other;
scanning line driving circuits capable of supplying scanning signals for said scanning lines; and
signal line driving circuits capable of supplying picture signals to said signal lines,
each of said color filters being formed of a colored composition for color filter according to claim 1.

4. A display comprising at least a first substrate having a plurality of scanning lines extending in a first direction and provided side by side in a second direction non-parallel to the first direction, a plurality of signal lines extending in said second direction and provided side by side in the first direction, current-supplying lines located in parallel with said signal lines, and a plurality of color pixels which are composed of an organic light-emitting layer capable of emitting white light and are formed at the intersections, respectively, of said scanning lines and said signal lines;
a second substrate having color filters of two or more colors located so as to face the plurality of said pixels, respectively;
scanning line driving circuits capable of supplying scanning signals for said scanning lines; and
signal line driving circuits capable of supplying picture signals to said signal lines,
each of said color filters being formed of a colored composition for color filter according to claim 1.

5. A colored composition for color filter comprising a base polymer containing a polyamicacid whose light transmittance decreases by 2% or less in the visible region (wavelength: 400 nm to 800 nm), at least one coloring agent and at least one solvent, wherein a phthalocyanine derivative having a structure represented by the following general formula (II) is used as said coloring agent:

wherein y is a number of 0 to 16; z is a number of 1 to 2, and y+z is greater than or equal to 1; Pc is phthalocyanine; M is $H_2$, Ni, Zn, Cu, Fe, V, Ti, Si or Ge; C is a side chain group bonded to an aromatic ring contained in Pc and is selected from chlorine atom, alkyl groups (—$(CH_2)_n CH_3$ wherein n is an integer of 0 to 20), alkoxyl groups (—O—$(CH_2)_m CH_3$, wherein m is an integer of 0 to 20), oxymethylene group s (—O—$(CH_2$—O$)_k CH_3$ wherein k is an integer of 0 to 20) and alkoxysilane residues (—Si(—O—$(CH_2)_m CH_3$ wherein m is an integer of 0 to 20), and of these, the alkyl group and the alkoxyl group may contain a functional group for polymerization and addition; and D is a substituent bonded to M and having an oxygen atom as a spacer, namely, D is represented by the following structural formula (2):

 (2)

6. A colored composition for color filter according to claim 5, wherein N-methylpyrrolidone or γ-butyrolactone, or both, are contained as said solvent(s).

7. A display comprising at least a first substrate having a plurality of scanning lines extending in a first direction and provided side by side in a second direction non-parallel to the first direction, a plurality of signal lines extending in said second direction and provided side by side in the first direction, and a plurality of color pixels formed at the intersections, respectively, of said scanning lines and said signal lines;

a second substrate having color filters of two or more colors located so as to face the plurality of said pixels, respectively;

a liquid crystal layer enclosed in a gap formed by sticking said first substrate and said second substrate to each other;

scanning line driving circuits capable of supplying scanning signals for said scanning lines; and signal line driving circuits capable of supplying picture signals to said signal lines, each of said color filters being formed of a colored composition for color filter according to claim 5.

8. A display comprising at least a first substrate having a plurality of scanning lines extending in a first direction and provided side by side in a second direction non-parallel to the first direction, a plurality of signal lines extending in said second direction and provided side by side in the first direction, current-supplying lines located in parallel with said signal lines, and a plurality of color pixels which are composed of an organic light-emitting layer capable of emitting white light and are formed at the intersections, respectively, of said scanning lines and said signal lines;

a second substrate having color filters of two or more colors located so as to face the plurality of said pixels, respectively;

scanning line driving circuits capable of supplying scanning signals for said scanning lines; and signal line driving circuits capable of supplying picture signals to said signal lines, each of said color filters being formed of a colored composition for color filter according to claim 5.

* * * * *